US008960974B2

(12) United States Patent
Yabe et al.

(10) Patent No.: US 8,960,974 B2
(45) Date of Patent: Feb. 24, 2015

(54) LIGHT SOURCE DEVICE

(75) Inventors: Mitoru Yabe, Tokyo (JP); Yukio Sato, Tokyo (JP); Toru Yoshihara, Tokyo (JP); Tetsuo Funakura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 946 days.

(21) Appl. No.: 12/830,516

(22) Filed: Jul. 6, 2010

(65) Prior Publication Data

US 2011/0096542 A1 Apr. 28, 2011

(30) Foreign Application Priority Data

Oct. 28, 2009 (JP) ................................ 2009-248213

(51) Int. Cl.

| | |
|---|---|
| ***F21V 19/00*** | (2006.01) |
| ***H01S 5/022*** | (2006.01) |
| ***H01S 5/02*** | (2006.01) |
| *H01S 5/00* | (2006.01) |
| *H01S 5/024* | (2006.01) |
| *H01S 5/40* | (2006.01) |

(52) U.S. Cl.

CPC ............... *H01S 5/02212* (2013.01); *H01S 5/02* (2013.01); *H01S 5/005* (2013.01); *H01S 5/02415* (2013.01); *H01S 5/4012* (2013.01)

USPC ...... 362/382; 362/235; 362/259; 362/249.01; 362/227

(58) Field of Classification Search

USPC .................... 362/235, 249.01, 382, 259, 227

See application file for complete search history.

(56) References Cited

U.S. PATENT DOCUMENTS

| | | | | |
|---|---|---|---|---|
| 6,097,749 | A * | 8/2000 | Naoe et al. | 372/103 |
| 6,621,512 | B2 * | 9/2003 | Nakajima et al. | 347/245 |
| 7,151,557 | B2 * | 12/2006 | Boyatt et al. | 347/252 |
| 7,347,629 | B2 * | 3/2008 | Shibayama et al. | 385/88 |
| 2003/0214987 | A1 | 11/2003 | Yamanaka et al. | |
| 2004/0104643 | A1 | 6/2004 | Kawauchi et al. | |
| 2004/0233964 | A1 | 11/2004 | Yamanaka et al. | |
| 2006/0222042 | A1 | 10/2006 | Teramura et al. | |
| 2008/0019412 | A1 * | 1/2008 | Ishibashi | 372/101 |

FOREIGN PATENT DOCUMENTS

| | | | |
|---|---|---|---|
| CN | 1447456 | A | 10/2003 |
| CN | 1519613 | A | 8/2004 |
| JP | 2003-98413 | A | 4/2003 |
| JP | 2006-147753 | A | 6/2006 |
| JP | 2006-284851 | A | 10/2006 |
| JP | 2008-70625 | A | 3/2008 |

(Continued)

*Primary Examiner* — Anh Mai
*Assistant Examiner* — Jessica M Apenteng
(74) *Attorney, Agent, or Firm* — Birch, Stewart, Kolasch & Birch, LLP

(57) ABSTRACT

Included are a plurality of cylindrical holders having holes into which laser modules are fitted and fixed, respectively; a plate-like base that has a first surface, a second surface opposite to the first surface, and a plurality of through holes through which the laser beams from the plurality of laser modules fixed to the holder pass, the holders abutting against the first surface so as to connect the holes thereof to the through holes of the base, the second surface of the base being arranged with a plurality of lenses corresponding to the through holes; and adhesives applied to outer corners of abutment portions, at which the base and the LD holders abut against each other, for fixing the base and the LD holders to each other.

9 Claims, 17 Drawing Sheets

21a 21b (LD-III) 19 1 1k (LD HOLDER-III) 20 19 (LD-VI) (LD-I) 19 20 (LD HOLDER-VI) (LD HOLDER-I) 20 1 1 19 (LD-VII) (LD-II) 19 20 (LD HOLDER-VII) (LD HOLDER-II) 20 19 (LD-V) (LD-IV) 19 (LD HOLDER-IV) 20 19a 20 (LD HOLDER-V) 19b

(56) References Cited

FOREIGN PATENT DOCUMENTS

| | | | |
|---|---|---|---|
| JP | 4084068 | B2 | 4/2008 |
| JP | 4115732 | B2 | 7/2008 |
| JP | 2008-203546 | A | 9/2008 |
| JP | 2008-235509 | A | 10/2008 |
| JP | 2009-109663 | A | 5/2009 |
| JP | 2009-110811 | A | 5/2009 |
| JP | 2009-246040 | A | 10/2009 |

* cited by examiner 16
15
14
8
18
18
18
18
13
9
10
11
12
12a
17a
17
17c
17b
7
6b
6a
6
5b
5a
5
4
3
2
1c
1a
1f
1h
1
1i
1b
1d
1e
1g
1j
LD HOLDER-I
LD HOLDER-II
20
LD HOLDER-III
LD HOLDER-IV
LD HOLDER-VI
20a
LD HOLDER-VII
LD HOLDER-V
LD-I
LD-II
19
LD-VI
LD-VII
LD-IV
LD-III
LD-V

LIGHT SOURCE DEVICE

BACKGROUND OF THE INVENTION

1. Field of the Invention

The present invention relates to a light source device used for a picture display device or the like, and more particularly to a light source device that synthesizes laser beams emitted from a plurality of semiconductor laser devices and concentrates the beams into an optical fiber in order to obtain a predetermined light output.

2. Description of the Related Art

A conventional light source device, which synthesizes laser beams emitted from a plurality of semiconductor laser devices and concentrates the beams into an optical fiber, in order to obtain a predetermined light output, is configured to include: a plurality of chip-like semiconductor lasers arranged and fixed on a heat block; collimator lens arrays provided corresponding to the semiconductor lasers; a condenser lens that concentrates collimator light flux generated by the collimator lens arrays into one optical fiber; and a box-like package that air-tightly seals these multiplexing optical systems.

According to the light source device of this kind, to concentrate laser beams emitted from the semiconductor laser devices into an optical fiber, the semiconductor laser devices, the collimator lens arrays, the condenser lens, and the optical fiber must be fixed with a predetermined positional precision in a state that inclinations of these parts precisely match with each other. To fix these parts in this manner, there is proposed a structure in which inclinations of precisely formed parts are measured by a laser automatic collimator and in this state, these parts are positioned precisely by a mechanical hand and are adhered and fixed (see, for example, Japanese Patent Application Laid-open No. 2006-284851 (Page 7 and FIG. 1)).

When a semiconductor laser device having an emission wavelength in a range of 350 to 450 nanometers is used, organic gas (out gas) components of e.g., an adhesive for fixing multiplexing optical systems are deposited on a light emitting unit and an optical member, and this deteriorates laser characteristics. To solve this problem, there is proposed a light source device in which the concentration of organic gas in a package is limited to less than 1000 parts per million (ppm), and inert gas having an oxygen concentration in a range of 1 to 100 ppm is enclosed into the package (see, for example, Japanese Patent No. 4115732 (Page 5 and FIG. 2)).

According to the conventional light source devices, parts such as a semiconductor laser device, a collimator lens array, a condenser lens, and an optical fiber are individually adjusted in position and assembled while measuring inclinations thereof. It is necessary to perform positioning operations many times for each semiconductor laser device, and thus there is a problem that the operability in assembling is not good.

Further, because an adhesive is interposed between joint surfaces of these parts, there is a possibility that a positioned part is deviated when the adhesive is cured. Therefore, it is necessary to form each part extremely precisely and the device become expensive, yet there is a problem that positional deviation or optical deviation (inclination of optical axis and aberration) between the laser device and a lens cannot be optimally adjusted, and the coupling efficiency is deteriorated. Further, when an ultraviolet cure adhesive is used, one of parts that are to be bonded must have ultraviolet permeability, and thus materials used for the parts are limited.

It is also necessary to air-tightly seal the optical system, to manage the concentration of organic gas in a package, and to enclose inert gas in the package. Therefore, there is a problem that the device becomes more expensive and the operability in assembling is deteriorated, and thus the device cannot be easily applied to inexpensive consumer devices.

The present invention has been achieved in view of the above problems, and an object of the present invention is to provide a light source device capable of easily and precisely adjusting positions of optical axes of a semiconductor laser device and a lens.

SUMMARY OF THE INVENTION

It is an object of the present invention to at least partially solve the problems in the conventional technology.

A light source device, according to an aspect of the present invention, that concentrates laser beams emitted from a plurality of laser modules and emits the concentrated laser beams includes a plurality of cylindrical holders each of which has a hole into which the each laser module is fitted and fixed; a plate-like base that has a first surface, a second surface opposite to the first surface, and a plurality of through holes through which the laser beams from the plurality of laser modules fixed to the holder pass, the holders abutting against the first surface so as to connect the holes thereof to the through holes of the base, the second surface of the base being arranged with a plurality of lenses corresponding to the through holes; and adhesives applied to outer corners of abutment portions, at which the base and the holders abut against each other, for fixing the base and the holders to each other.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a light source device according to the present invention will be explained below in detail with reference to the accompanying drawings. The present invention is not limited to the embodiments.

Figure 1:
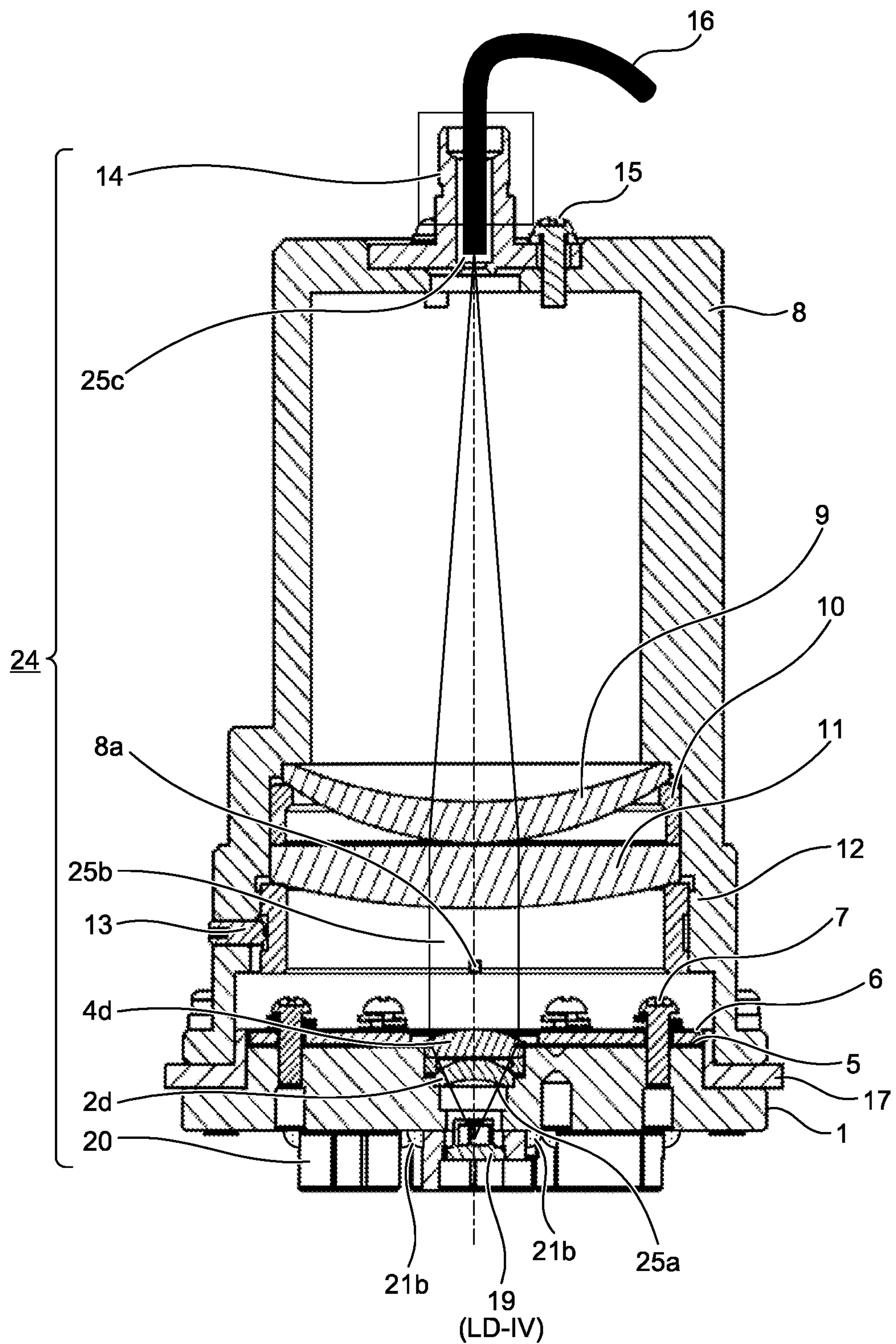
FIG. 1 depicts a sectional view of a configuration of a light source device according to an embodiment of the present invention.
Figure 2:
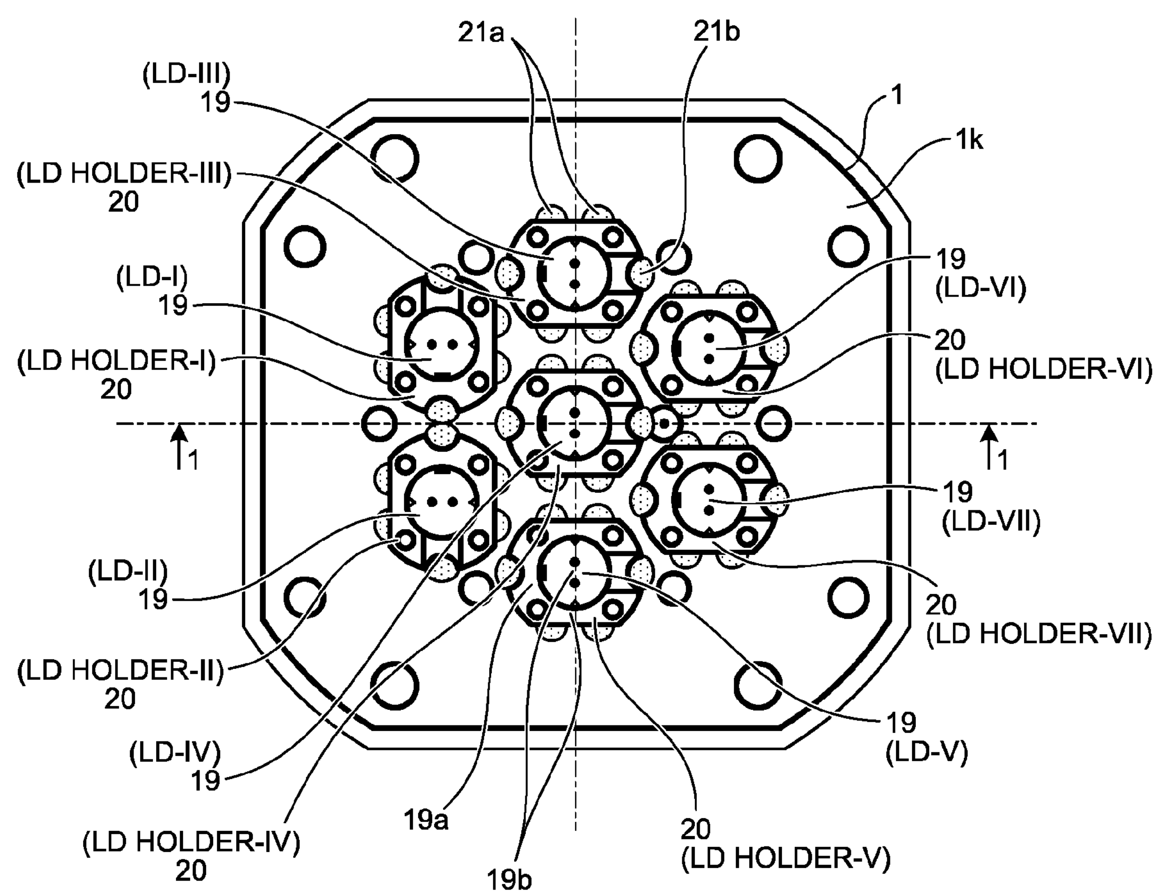
FIG. 2 depicts a bottom view of a configuration of the light source device according to the embodiment.
Figure 3:
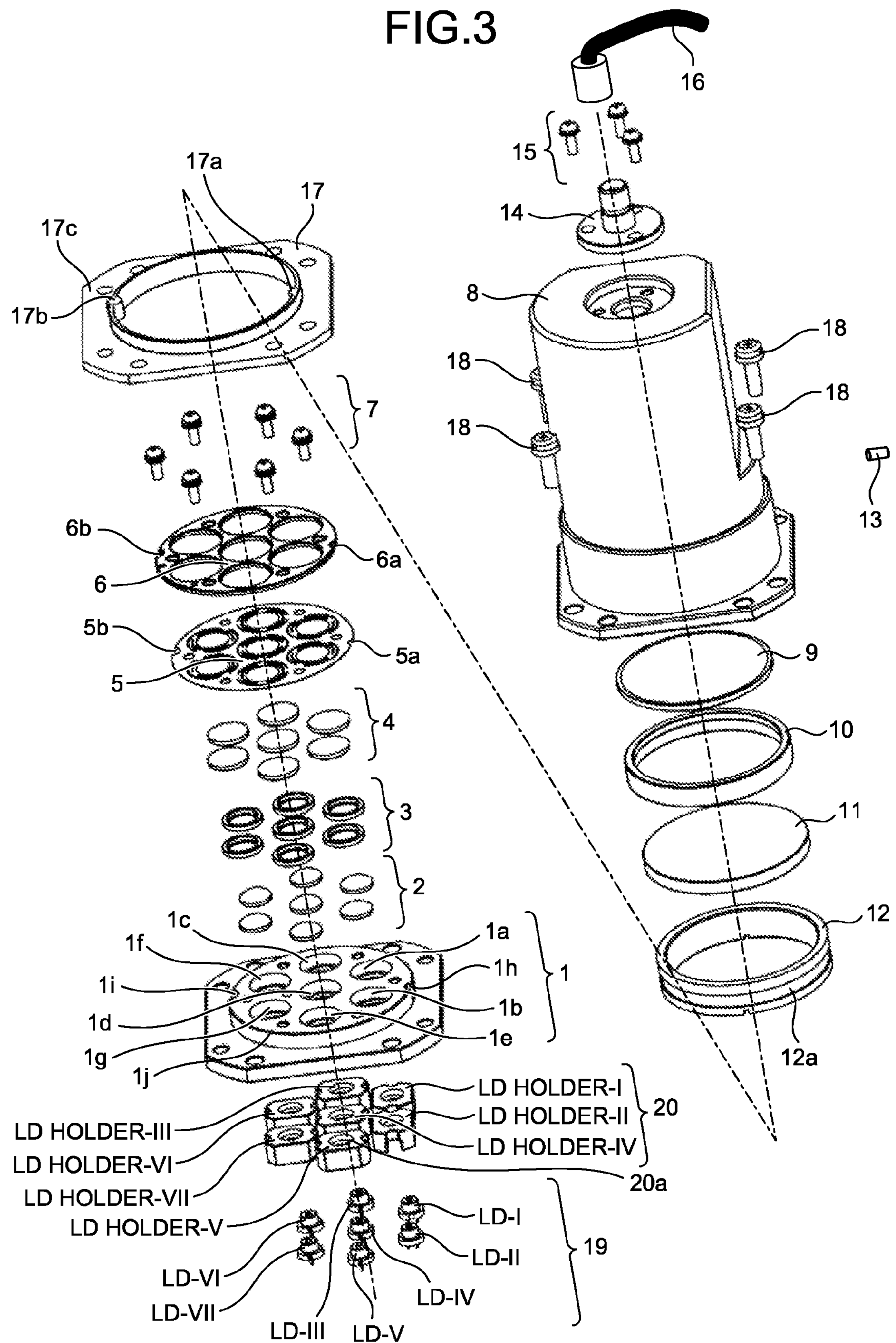
FIG. 3 depicts an exploded view of a configuration of the light source device according to the embodiment.

FIGS. 1 to 3 depict a configuration of a light source device according to an embodiment of the present invention, where FIG. 1 is a sectional view, FIG. 2 is a bottom view, and FIG. 3 is an exploded view. FIG. 1 is the sectional view taken along a line 1-1 in FIG. 2.

A base 1 is formed from aluminum die-cast, seven stepped holes 1*a* to 1*g* in total are formed in the base 1 at a center and on a circumference around this center at equal distances from one another on the circumference. Semi-circular notches 1*h* and 1*i* having different sizes are precisely formed in outer peripheral portions of the base 1. Centers of the notches 1*h* and 1*i* are asymmetric about a center of the stepped hole 1*d* formed at the central portion. A first collimator lens 2, a first spacer 3, and a second collimator lens 4 are fitted to each of the seven stepped holes 1*a* to 1*g*, and the second collimator lens 4 slightly projects from an upper surface 1*j* of the base 1. A leaf spring 5 is formed into a flat-plate shape by etching a spring stainless steel (SUS301) such that gimbal spring-like spring portions are provided at positions corresponding to the seven stepped holes 1*a* to 1*g* of the base 1. Notches 5*a* and 5*b* are provided at positions corresponding to the notches 1*h* and 1*i* of the base 1. A restraining plate 6 is formed into a flat-plate shape by stamping a stainless material (SUS304) thicker than the leaf spring 5 such that holes corresponding to the seven stepped holes 1*a* to 1*g* of the base 1 and notches 6*a* and 6*b* corresponding to the notches 1*h* and 1*i* of the base 1 are formed. The restraining plate 6 presses the leaf spring 5 so that a portion thereof except the spring portion is not deformed. The leaf spring 5 and the restraining plate 6 are fixed without deviation by a plurality of screws 7 such that the notches 5*a*, 5*b*, 6*a*, and 6*b* match with the notches 1*h* and 1*i* of the base 1, and the leaf spring 5 and the restraining plate 6 are pressed against the upper surface 1*j* of the base 1. Because the notches 1*h* and 1*i* are arranged asymmetric around the center of the stepped hole 1*d* that is arranged at the central portion, front and back surfaces of the leaf spring 5 and the restraining plate 6 are determined uniquely. Also, the leaf spring 5 and the restraining plate 6 do not float or deviate from each other due to a burr or a flatness of the part. With the above configuration, a collimator lens group, which includes the first collimator lens 2, the first spacer 3, and the second collimator lens 4, is precisely fixed to the base 1 such that a deviation is not generated even if a vibration or an impact is applied. Because an adhesive is not used, even if it becomes necessary to disassemble the device for removing a foreign matter, the device can be disassembled such that all of the parts can be reused, and the optics such as the first collimator lens 2 and the second collimator lens 4 are not contaminated by out gas of an adhesive.

A lens barrel 8 is made by cutting aluminum. A first condenser lens 9, a second spacer 10, and a second condenser lens 11 are fitted into the lens barrel 8, and they are fixed by a screw ring 12. The second spacer 10 and the screw ring 12 are made of brass. A recess 12*a* is provided in a central portion of a side surface of the screw ring 12. A setscrew 13 is screwed from a side surface of the lens barrel 8, and a tip end of the setscrew 13 is inserted into the recess 12*a*. With this arrangement, the recess 12*a* is fixed to the lens barrel 8 such that it is not loosened. A receptacle 14 made of brass is fixed to an upper surface of the lens barrel 8 by screws 15 such that an optical fiber 16 can be attached and detached. With this configuration, a condenser lens group formed of the first condenser lens 9, the second spacer 10, and the second condenser lens 11 is precisely fixed to the base 1 such that the group is not deviated even if a vibration or an impact is applied to the group. Because an adhesive is not used, even if it becomes necessary to disassemble the device for removing a foreign matter, the device can be disassembled such that all of parts can be reused without damaging the screw portion of the screw ring 12. Also, the optics such as the first condenser lens 9, the second condenser lens 11 and the optical fiber 16 are not contaminated by out gas of an adhesive.

A spacer 17 is a molded article made of polycarbonate having glass fibers, and the base 1 is fitted into a cylindrical portion of the spacer 17. Projections 17*a* and 17*b* corresponding to the notches 1*h* and 1*i* of the base 1 are formed inside of the cylindrical portion. A projection 17*c* corresponding to the notch 8*a* provided in the lens barrel 8 is provided on outside of the cylindrical portion. In a state that the base 1 and the lens barrel 8 are positioned precisely, they are fastened to the spacer 17 by four conductive screws 18 so that they are restrained from rotating, and a light source module 24 is formed. Because thermal conductivity of the spacer 17 is sufficiently lower than those of the base 1 and the lens barrel 8, heat is not easily transmitted between the base 1 and the lens barrel 8. In addition, because the base 1 and the lens barrel 8 are fastened to each other by the conductive screws 18, they are electrically conductive.

Semiconductor lasers (hereinafter, Laser Diodes (LDs)) 19 are light sources that emit blue light having wavelength of 445 nanometers. Relative orientations in rotating directions of optical axes (polarizing directions) of the seven LDs 19 with respect to an LD holder 20 are all the same, and the LDs 19 are press-fitted to the LD holder 20. There are seven LDs 19 and LD holders 20 corresponding to the collimator lens group. In the following explanations, when it is necessary to distinguish a certain one among the LDs 19 from each other, they are described as LD-I to LD-VII. When it is necessary to distinguish a certain one among the LD holders 20 from each other, they are described as LD holders I to VII. An upper surface 20*a* of the LD holder 20 to which the LD 19 is press-fitted is arranged such that the upper surface 20*a* abuts against a bottom surface 1*k* of the base 1. Optical axes of the LDs 19 and the optical axes of the collimator lens groups are adjusted to appropriate positions on the abutment surfaces, and the LD holder 20 is adhered and fixed to the base 1 by acrylic-based ultraviolet cure adhesives 21*a* and 21*b*.

By fixing the lens barrel 8 made of metal to the base 1 by the conductive screws 18 through the plastic spacer 17, the ground of the LD 19 is electrically connected to the lens barrel 8 through the LD holder 20, the base 1, and the screws 18. Therefore, it is possible to suppress generation of unnecessary radiation when the LD 19 is pulse-driven at high frequencies. The lens barrel 8 can be fixed to a later-described Peltier module 34 through the plastic spacer 17 by using a conductive screw.

Figure 4A:
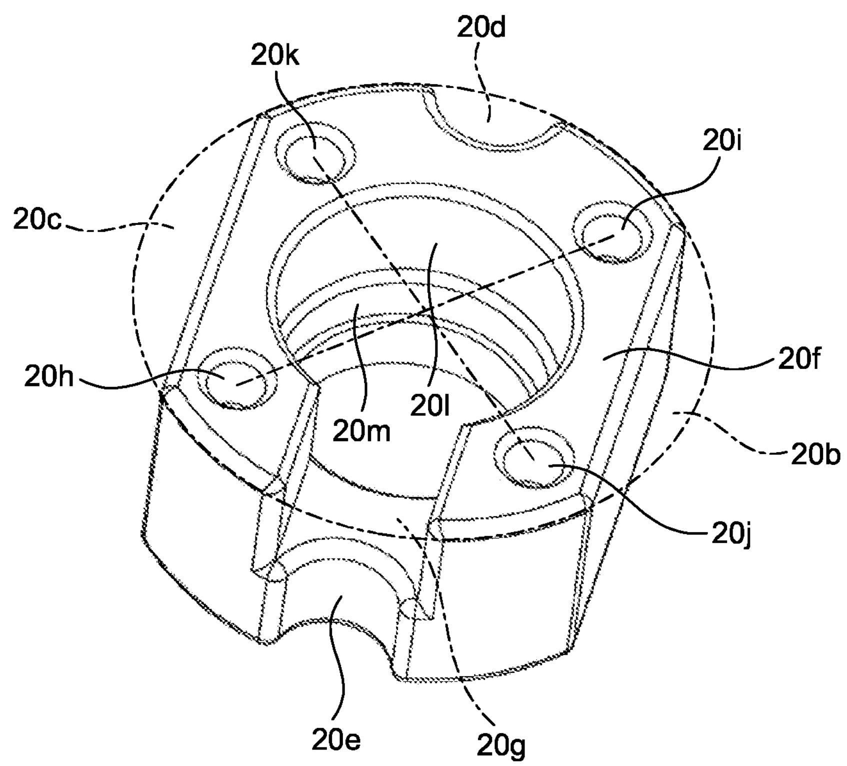
FIGS. 4A and 4B depict perspective views of a detailed configuration of an LD holder according to the embodiment.
Figure 4B:
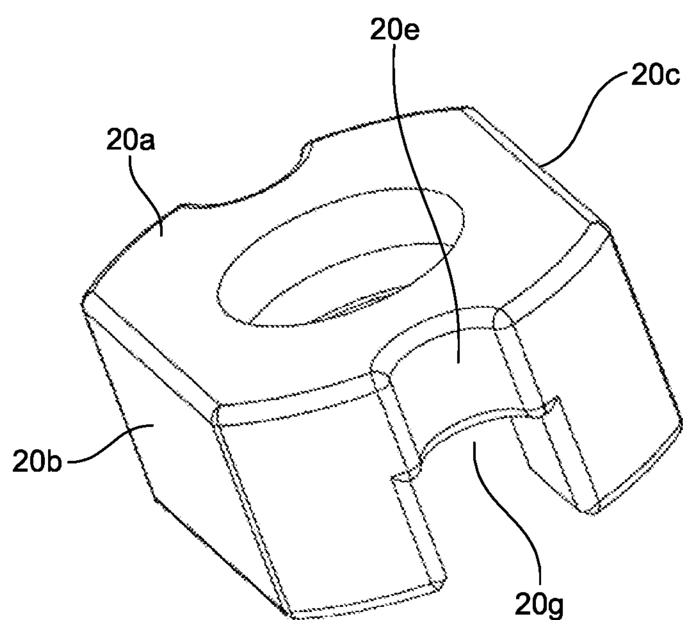

FIGS. 4A and 4B are perspective views of a detailed configuration of the LD holder 20. The LD holder 20 is of a substantially cylindrical shape, and an outer peripheral surface of the LD holder 20 includes two pairs of notched portions 20*b* and 20*c*, as well as 20*d* and 20*e* that are symmetric about a center axis of an inner surface hole 201. A stepped portion 20*g* and two pairs of hole portions 20*h* and 20*i* as well as 20*j* and 20*k*, which are symmetric about the optical axis of the LD 19, are provided in a lower surface 20*f* of the LD holder 20. The lower surface 20*f* is opposite from the upper surface 20*a* that abuts against the base 1. The hole portions 20*h* to 20*k* are provided such that a line connecting centers of the hole portions 20*h* and 20*i* and a line connecting centers of the hole portions 20*j* and 20*k* intersects with each other at a right angle. The inner surface hole 201 that is a cylindrical inner surface of the LD holder 20 is slightly larger in diameter than a press-fit hole 20*m* into which the LD 19 is inserted.

Figure 5:
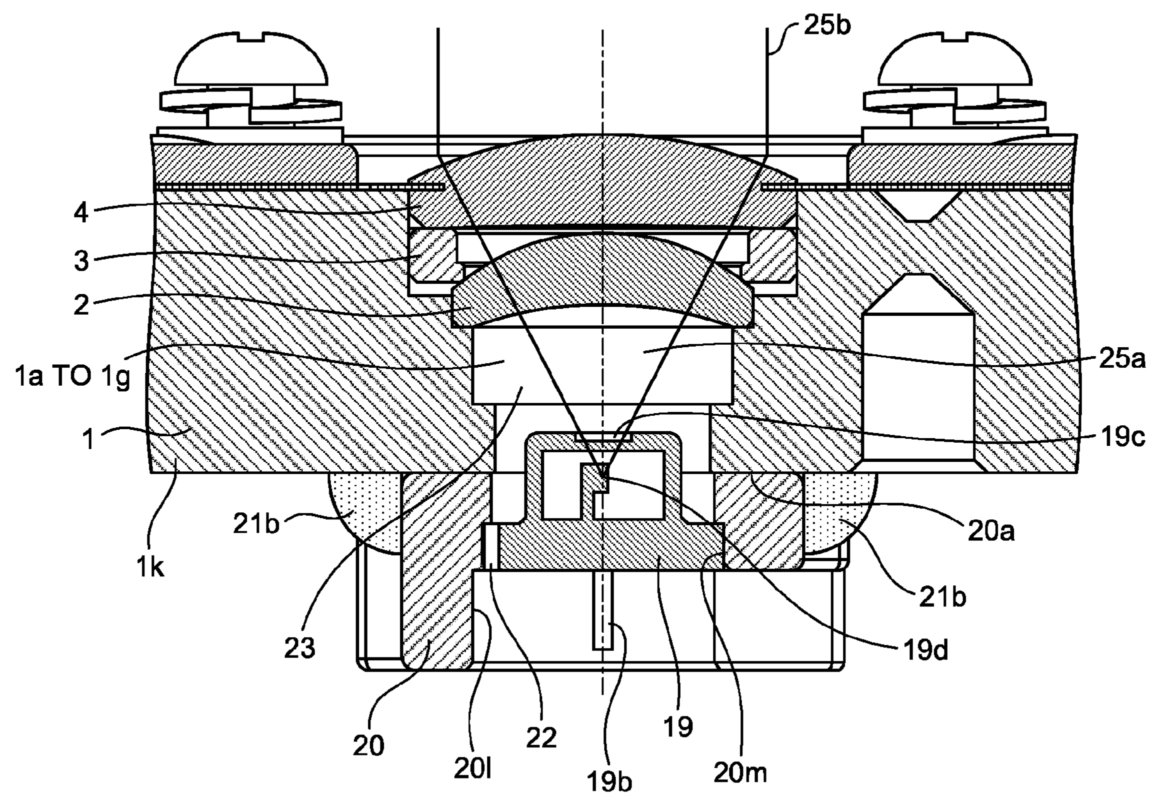
FIG. 5 depicts an enlarged view of a state after the LD holder into which an LD according to the embodiment is press-fitted is adhered and fixed to a base.
Figure 6:
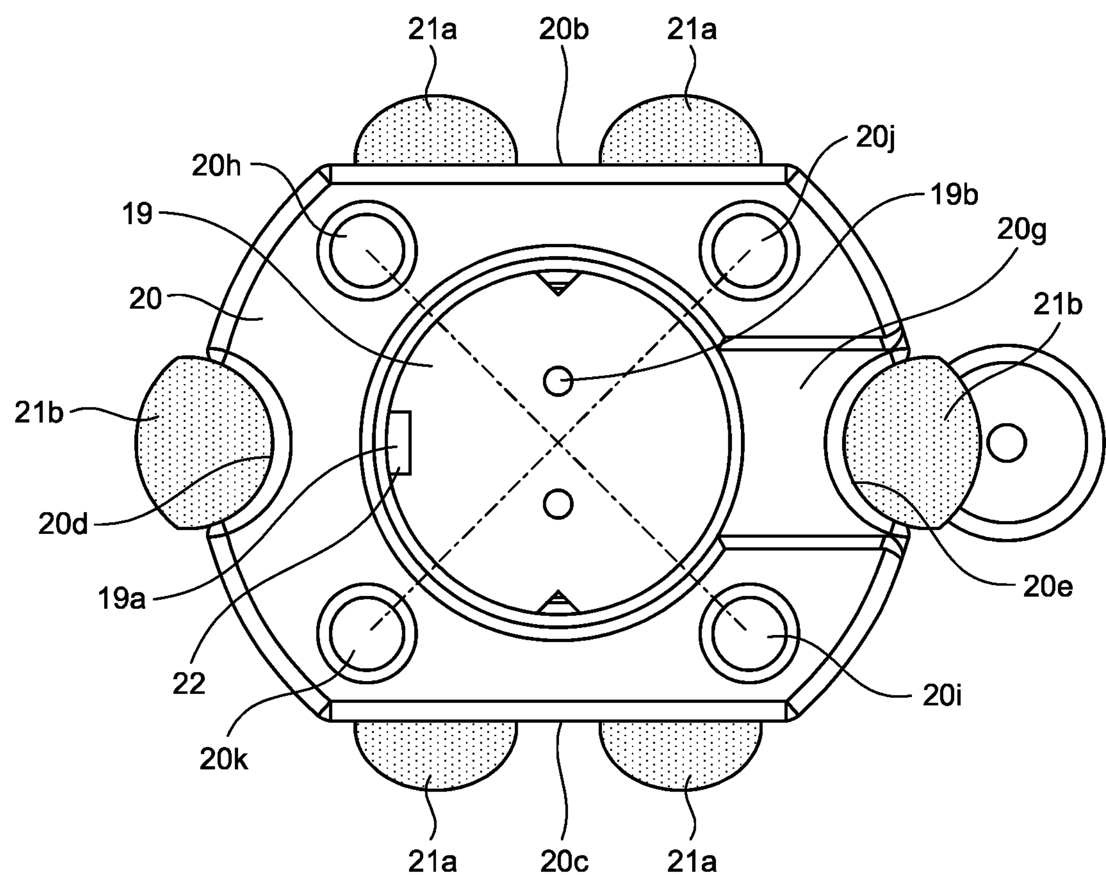
FIG. 6 depicts another enlarged view of a state after the LD holder into which the LD according to the embodiment is press-fitted is adhered and fixed to a base.

FIGS. 5 and 6 are enlarged views of a state after the LD holder 20 into which the LD 19 is press-fitted is adhered and fixed to the base 1. The LD 19 is a standard CAN package of ϕ5.6 millimeters, and includes a notch 19*a* on a stem and conduction leads 19*b*. A laser beam is emitted from a laser-beam emitting window 19*c*. A light emitting point 19*d* of the LD 19 is flush with the upper surface 20*a* of the LD holder 20 so that even if the LD holder 20 is inclined when adjusting its optical axis in position, an amount of positional deviation of the optical axis of the light emitting point 19*d* in the vertical direction can be suppressed to the minimum. With this configuration, its centering operability and reliability of a product are enhanced. The LD holder 20 is designed such that when the LD 19 is press-fitted, a through hole 22 is formed between the LD 19 and the inner surface hole 201 of the LD holder 20 by the notch 19*a* of the LD 19. That is, in a state that the LDs 19 are press-fitted into the LD holders 20 and are adhered and fixed to the base 1, small chambers 23, which are formed by the stepped holes 1*a* to 1*g* of the base 1, the first collimator lenses 2, the LD holders 20, and the LDs 19, are in communication with outside air through the through hole 22. The adhesive 21*a* that fixes the LD holder 20 is applied to four points that are substantially symmetric about the optical axis of the LD 19. The adhesive 21*a* straddle the bottom surface 1*k* of the base 1 and the notched portions 20*b* and 20*c*, which are an outer peripheral side surface of the LD holder 20. The adhesive 21*b* is applied substantially symmetrically about the optical axis of the LD 19 and straddle the bottom surface 1*k* of the base 1 and the notched portions 20*d* and 20*e*, which are the outer peripheral side surface of the LD holder 20. As shown in FIG. 2, the LD holders III to VII are arranged such that the stepped portions 20*g* are oriented to the same direction; however, the LD holder I is arranged in a direction rotated 90° and the LD holder II is arranged in a direction rotated −90°. The light source module 24 has the configuration described above.

The substantially cylindrical LD holder 20 has the notched portions 20*b* and 20*c* as well as 20*d* and 20*e* that are symmetric about the center axis thereof, and the adhesives 21*a* and 21*b* are applied to the notched portions 20*b* to 20*e*. This configuration can suppress the increase in adhering margins, narrow a distance between the optical axes, and reduce the sizes of the entire device. Because the adhesive is applied to a plurality of locations that are substantially symmetric about the optical axis of the LD 19, even if the adhesive is cured and shrunk or linearly expanded, these phenomena cancel out each other, and a positional deviation is not generated in the LD holder 20. With this configuration, the yield of the light source device can be enhanced.

An operation of the present embodiment is described next. Diverging light 25*a* emitted from the LD 19 is converted into parallel light 25*b* by the collimator lens group formed of the first collimator lens 2 and the second collimator lens 4. Furthermore, the light 25*b* is concentrated on an end surface of the optical fiber 16 having a diameter of 400 micrometers by the condenser lens group formed of the first condenser lens 9 and the second condenser lens 11. Incidentally, precision of the parts and precision of assembling position have errors from design center values. A focal point 25*c* can be deviated from the end surface of the optical fiber 16 and a loss can be generated, and the amount of light entering the optical fiber 16 can be reduced in some cases. In this embodiment, when the LD 19 is moved in a direction intersecting with the optical axis at right angles, the optical axis of the parallel light 25*b* is inclined, and the focal point 25*c* can be moved in the direction intersecting with the optical axis at right angles. Therefore, a positional deviation of the light emitting point 19*d* of the LD 19, positional deviations of the optical axes of the first collimator lenses 2*a* to 2*g* and the second collimator lenses 4*a* to 4*g*, inclinations of the first condenser lens 9 and the second condenser lens 11, and a positional deviation of the receptacle 14 can be absorbed by adjusting the position of the LD 19 in the direction intersecting with the optical axis at right angles. Thus, the focal point 25*c* can be aligned with the end surface of the optical fiber 16.

An adjusting and fixing method according to the present embodiment is explained next with reference to FIGS. 7 to 10. A movable block 26 is driven in X, Y, and Z directions by an electric inching stage (not shown). Two pointed adjusting pins 27*a* and 27*b* capable of moving in the Z direction, and two UV fibers 28*a* and 28*b* for applying ultraviolet light (hereinafter, UV light) for curing the adhesive are fixed. The two adjusting pins 27*a* and 27*b* are elastically supported independent from each other to push the LD holder 20 against the bottom surface 1*k* of the base 1 (in a +Z direction in FIGS. 7 and 9). At this time, the pushing force of each of the adjusting pins 27*a* and 27*b* is set to about 0.05 Newton (5-gram weight) so that the LD holder 20 does not float from the bottom surface 1*k* of the base 1, but smoothly moves on the abutment surface. The UV fibers 28*a* and 28*b* are arranged such that a pair of the notched portions 20*b* and 20*c* of the LD holder 20 and the bottom surface 1*k* of the base 1 near the notched portions are irradiated with light at those spots. A socket (not shown) for supplying current is mounted on the LD 19 so that the LD 19 can emit light at a predetermined current.

The light source module 24 before the LD 19 and the LD holder 20 are fixed thereto is mounted on a fixing block 29 with no backlash. To facilitate understanding of the configuration, the fixing block 29 is shown with broken lines in FIGS. 7 and 9 and members located behind the fixing block 29 are shown through the fixing block 29. The optical fiber 16 is mounted on the receptacle 14, and a laser beam emitted from the end surface of the opposite end surface of the optical fiber 16 is received by an optical power meter 30.

Figure 7:
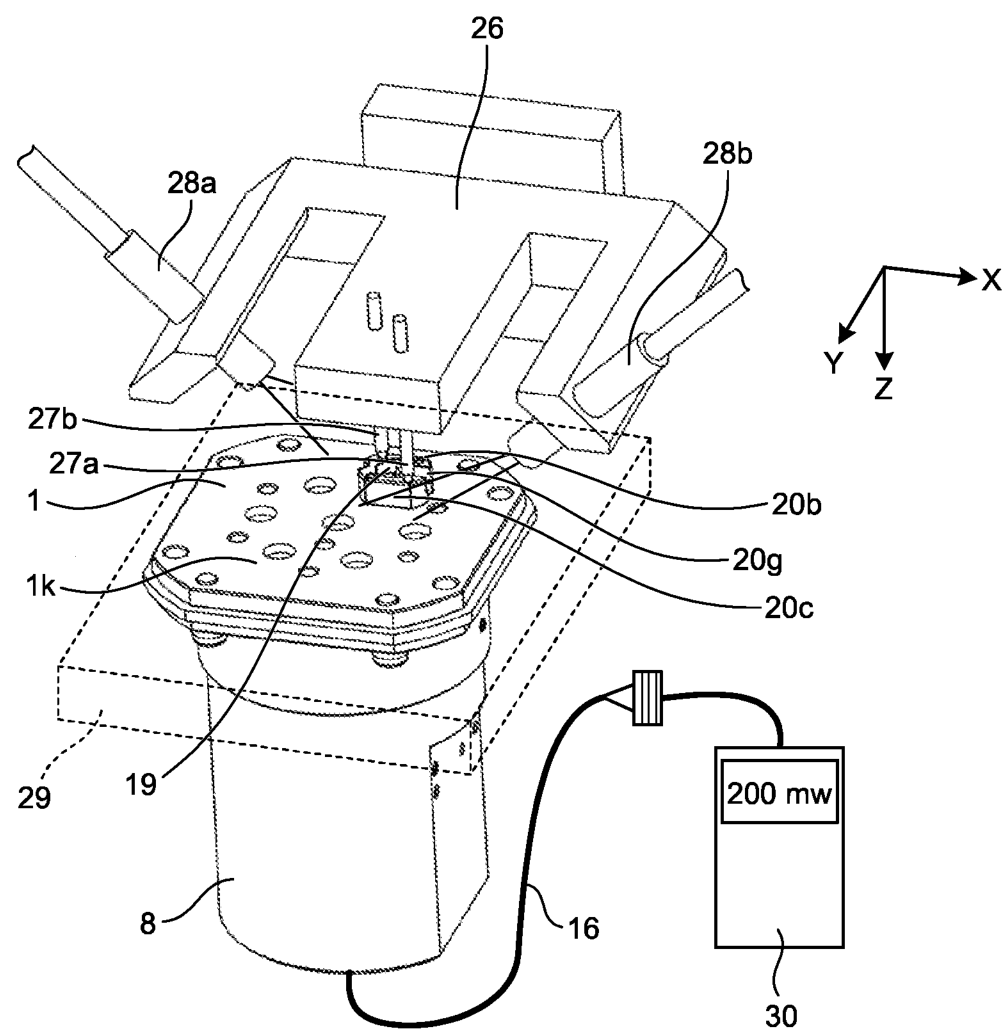
FIG. 7 depicts a perspective view explaining an adjusting and fixing method of an LD-I according to the embodiment.
Figure 8:
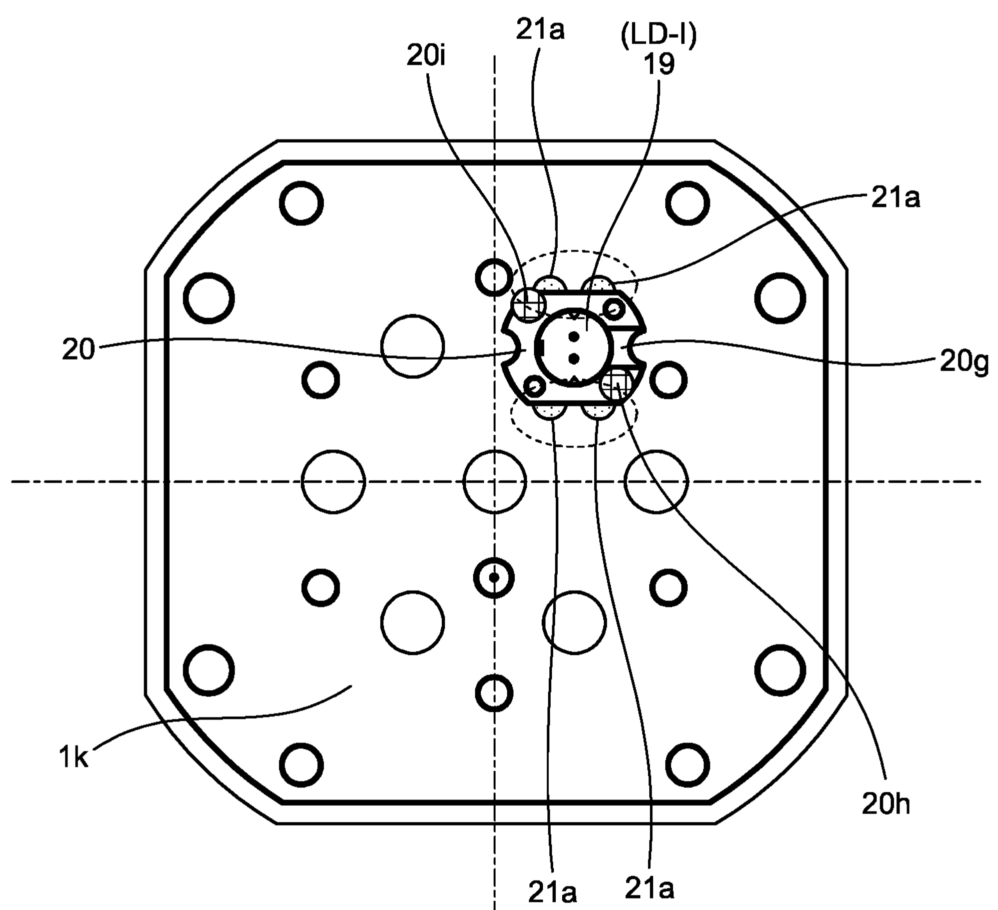
FIG. 8 depicts a bottom view explaining the adjusting and fixing method of the LD-I according to the embodiment.

When the LD-I is to be adjusted and fixed, as shown in FIGS. 7 and 8, the LD holder 20 into which the LD 19 is press-fitted is set, and the adjusting pins 27*a* and 27*b* are inserted into a pair of the hole portions 20*h* and 20*i*. At this time, the stepped portion 20*g* of the LD holder 20 is set such that it is oriented rightward (the +X direction) in FIG. 8. In this state, current of a predetermined current value is made to flow through the LD-I, the movable block 26 is made to move in the X and Y directions such that laser power emitted from the optical fiber 16 becomes maximum, a user checks that the laser power becomes greater than a standard power that was previously obtained by calculation. The adhesive 21*a* is applied to the four locations about the optical axis of the LD 19 so as to straddle the bottom surface 1*k* of the base 1 and the notched portions 20*b* and 20*c* of the outer peripheral surface of the LD holder 20. Then, the adhesive 21*a* is irradiated with UV light from the UV fibers 28*a* and 28*b* and the adhesive 21*a* is cured. There is nothing that cuts off UV light emitted to the adhesive 21*a*, and the adhesive 21*a* can be reliably irradiated with UV light and cured. Because the adhesive 21*a* is applied to the locations symmetric about the LD holder 20, a deviation of the LD holder 20 is not easily generated when the adhesive is cured and shrunk or linearly expanded. Even if the LD holder 20 is inclined, because the positional deviation of the light emitting point 19*d* is not easily generated, a value of the optical power meter 30 is not varied at the time of adjustment. Thus, the adjusting operability is excellent. Also, because the position of the light emitting point 19*d* is not easily changed with respect to the inclination of the LD holder 20, a light source device having higher reliability can be provided.

Next, when the LD-II is to be adjusted and fixed, the LD holder 20, into which the LD 19 is press-fitted, is set on the left side of the LD-I that is adhered and fixed as shown in FIG. 8 such that the stepped portion 20*g* is oriented leftward (the −X direction). Thus, LD-II is adjusted and fixed in the same manner as the LD-I.

Figure 9:
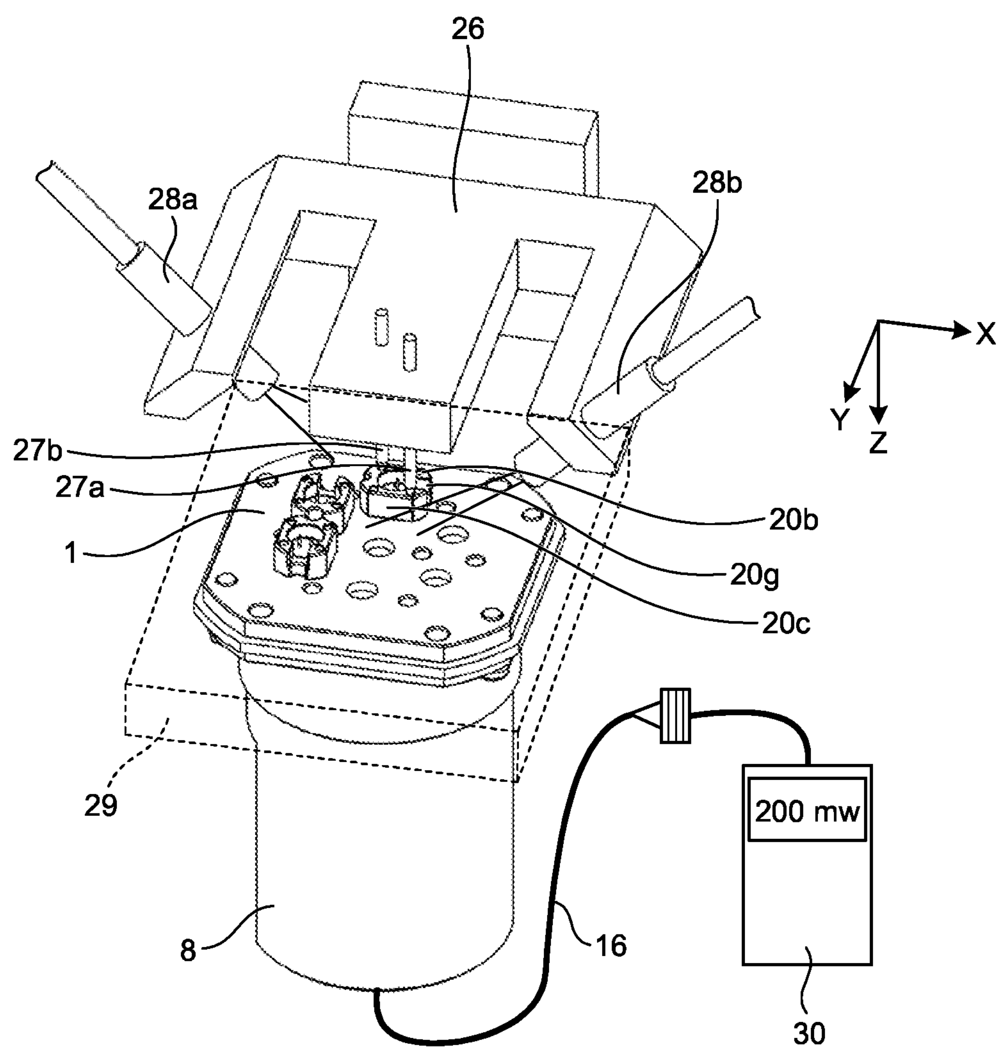
FIG. 9 depicts a perspective view explaining an adjusting and fixing method of an LD-III according to the embodiment.
Figure 10:
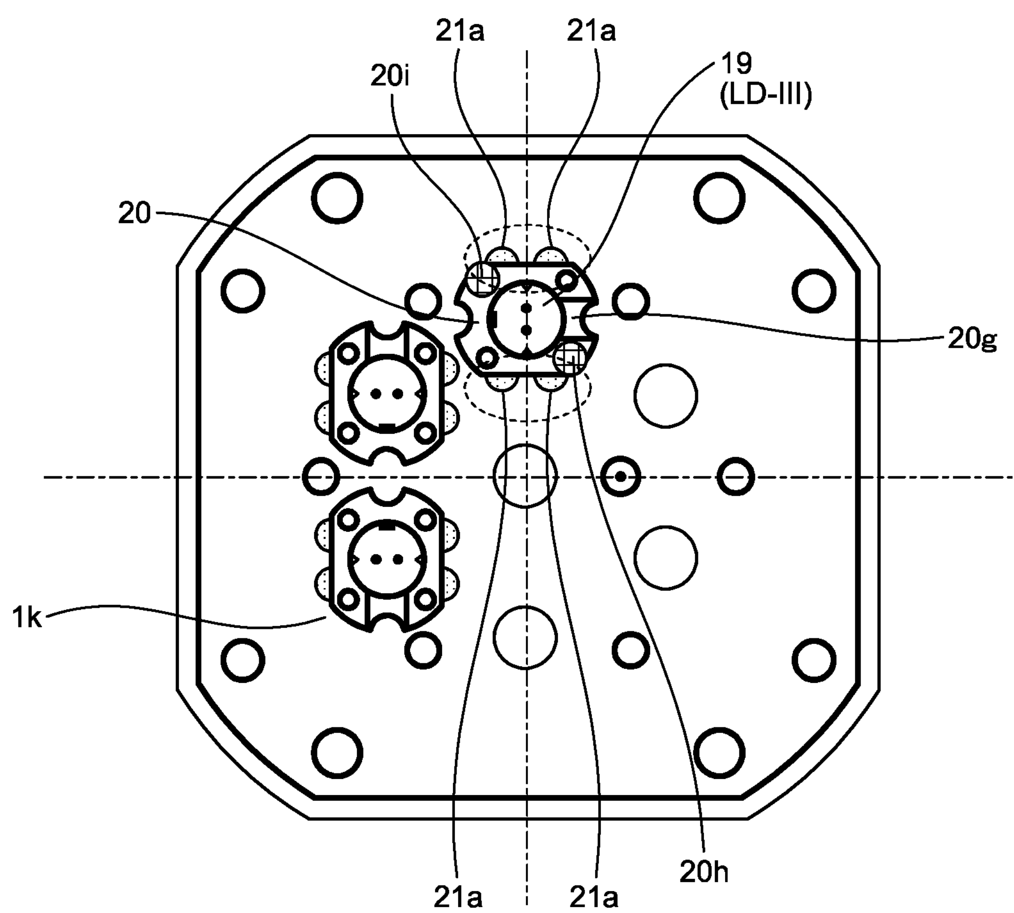
FIG. 10 depicts a bottom view explaining the adjusting and fixing method of the LD-III according to the embodiment.

When the LD-III is to be fixed, as shown in FIGS. 9 and 10, the LD holder 20, into which the LD 19 is press-fitted, is set such that the stepped portion 20*g* is oriented rightward (the +X direction) in FIG. 10 in a state that the fixing block 29 is rotated 90° in a counterclockwise direction. Then, the adjusting pins 27*a* and 27*b* are inserted into a pair of the hole portions 20*h* and 20*i*, and the LD-III is adjusted and fixed in the same manner as the LD-I. The LD-IV to LD-VII are adjusted and fixed in the same manner. In the method described above, the fixing block 29 is rotated 90° in the counterclockwise direction when the LD-III to LD-VII are adjusted and fixed; however, they can be also adjusted and fixed by inserting the adjusting pins 27*a* and 27*b* into a pair of the hole portions 20*j* and 20*k* without rotating the fixing block.

Figure 11:
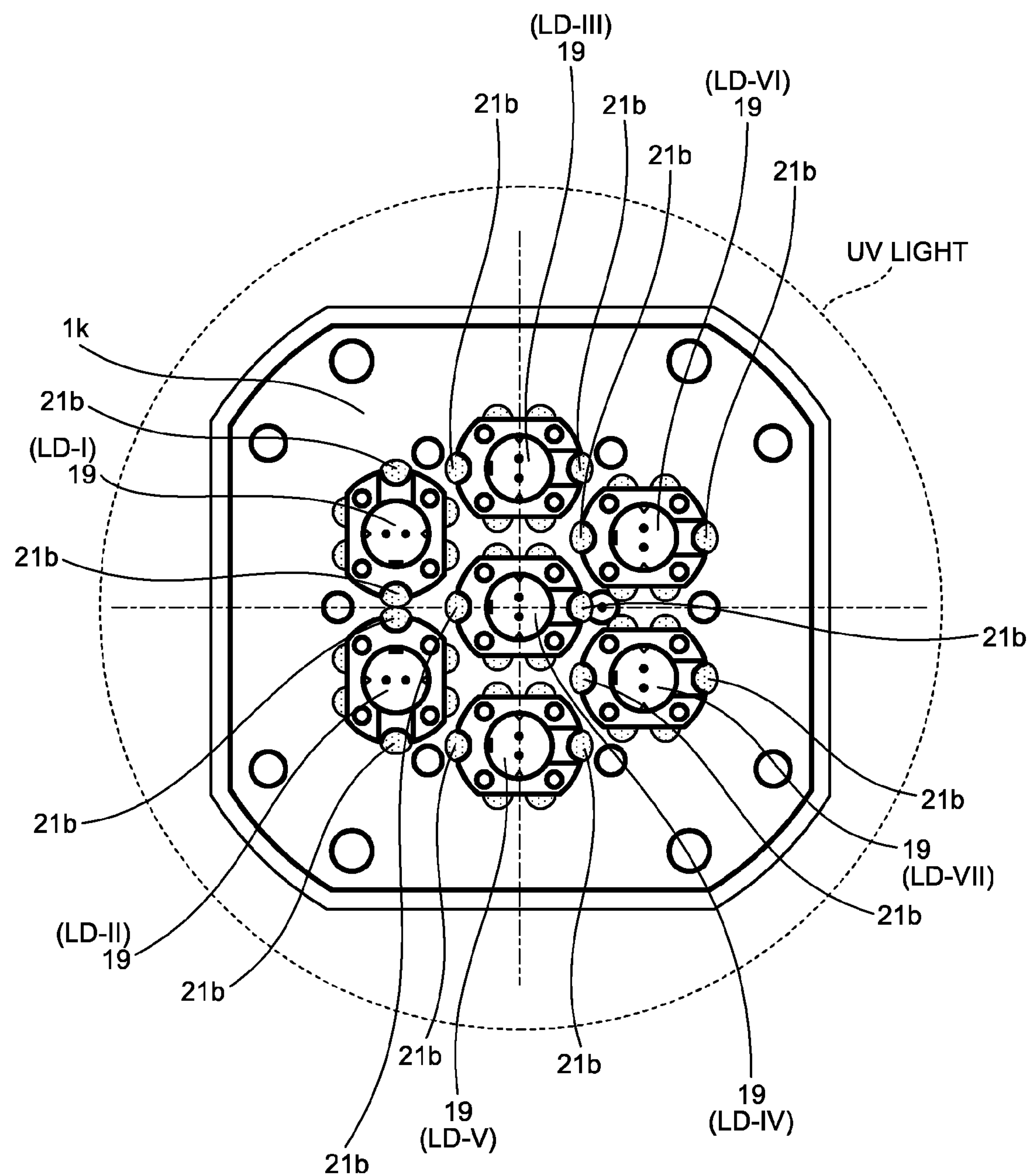
FIG. 11 depicts a bottom view explaining a method of additionally applying and curing an adhesive according to the embodiment.

When the adjusting and fixing operations of the LD-I to LD-VII are completed, the light source module 24 is removed from an adjusting device. The adhesive 21*b*, which is the same kind as the adhesive 21*a*, is applied to two locations of each of the seven LD holders 20 so as to straddle the bottom surface 1*k* of the base 1 and the notched portions 20*d* and 20*e* that are outer peripheral surface of the LD holder 20 as shown in FIG. 11. The seven LD holders 20 are collectively irradiated with UV light and adhesive is cured. Because the adhesive 21*b* is additionally applied to the locations of the LD holder 20 symmetrically and is cured, the positional deviation of the LD holder 20 is not caused by curing and shrinking of the adhesive 21*b* and the adhering strength of the LD holder 20 can be enhanced. Because the adhesives 21*a* and 21*b* are arranged symmetrically on the LD holder 20, to which the LD 19 is fixed, near the abutment surface between the base 1 and the LD holder 20, they are fixed such that a deviation of the LD holder 20 caused by linear expansion of the adhesives 21*a* and 21*b*, the positional deviation of the optical axis of the LD 19, and inclination of the optical axis are not generated almost at all. The stepped portions 20*g* of the LD-III to LD-VII of the LD holders 20 are arranged such that they are oriented in the same direction as shown in FIG. 2; on the contrary, the LD-I is arranged in the orientation rotated 90° and the LD-II is arranged in the orientation rotated 90° in the opposite direction. With this, the polarizing direction of the LD 19 is not constant, a polarizing direction of a laser beam that enters the optical fiber 16 is mixed, and thus color unevenness of a picture when an image is displayed can be suppressed (uniformity can be improved). That is, the LDs 19 are press-fitted into the LD holders 20 such that the polarizing directions thereof are set the same, and the LD holders 20 are fixed to the base 1 such that orientations of some of the LD holders 20 are changed. Therefore, the polarizing directions of the LDs 19 are mixed, and the color unevenness of a picture can be suppressed.

Because the positions of the lens and the optical axis of the LD 19 are adjusted on the abutment surface between the base 1 to which the lens barrel 8 is fixed and the LD holder 20 to which the LD 19 is fixed, the adjusting operations can be performed at one location. Also, variation in part size and variation in optical characteristics can be absorbed, and the centering operation to the optimal position can be performed. That is, by relatively moving the LD holder 20, to which the LD 19 is fixed, within the abutment surface with respect to the base 1 to which the optics (the first collimator lens 2, the second collimator lens 4, the first condenser lens 9, and the second condenser lens 11) is fixed, the position of the optical axis of the LD 19 can be adjusted with one positioning operation. Because the abutment surface of the base 1 and the side surface of the LD holder 20 are adhered to each other, they can be reliably fixed to each other even if the LD holder 20 and the base 1 do not have UV-permeability, and durability is enhanced. The adjusting pins 27*a* and 27*b* of the adjusting device are pressed against the position-adjusting recesses (the hole portions 20*h* to 20*k*) provided in the lower surface 20*f* of the LD holder 20 and the position adjustment is performed. Therefore, the position adjustment in the order of micron can be easily performed, a shadow of an adjusting jig does not appear on the adhesive, and the adhesive can be reliably irradiated with UV.

Figure 12:
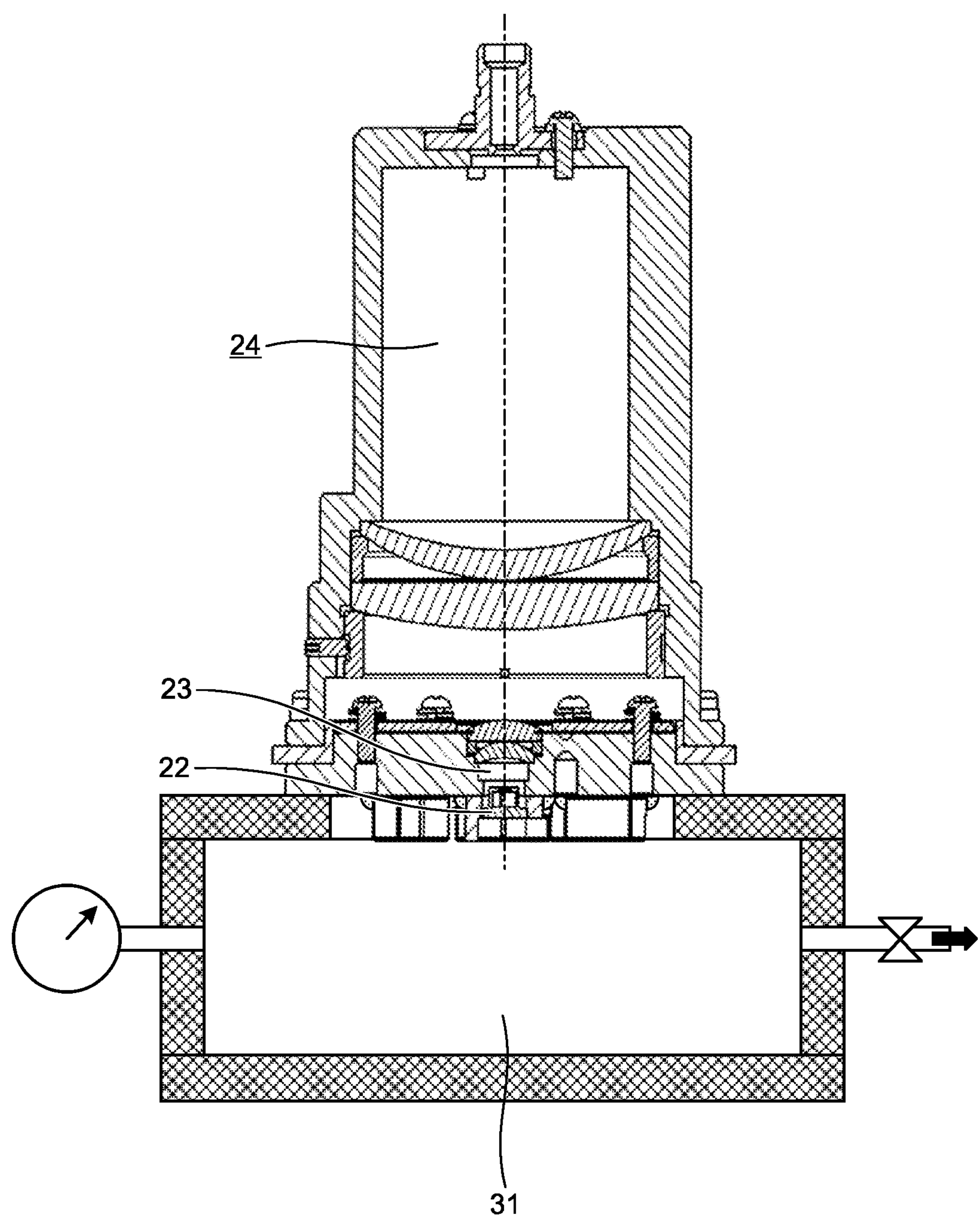
FIG. 12 depicts a schematic diagram explaining a method of sucking out gas according to the embodiment.

The LD holder 20 is adhered and cured with high reliability such that the LD holder 20 is not deviated when it is adhered and after it was adhered. However, because the adhesives 21*a* and 21*b* generate acrylate-based monomer (monomer of acrylic ester) as out gas when they are cured, the out gas enters the small chamber 23 through a gap of several microns due to surface roughness formed on the abutment surface of between the base 1 and the LD holder 20, and the out gas exists in a form of gas. If the LD 19 lights up in this state, out gases are superposed on each other by photon energy, and the out gasses become fine particles and adhere to peripheries. This fouling causes a problem that it adheres also to surfaces of the laser-beam emitting window 19*c* of the LD 19 and the first collimator lens 2, at which photon energy density is particularly high. The permeability of the laser beam emitted from the LD 19 is lowered over time. To avoid this problem, in the present embodiment, as shown in FIG. 12, the base 1 on the side of the bottom surface 1*k* is intimately mounted on a decompressor 31, and out gases dispersed in the small chambers 23 at seven locations are collectively sucked and removed from the through hole 22. As described above, the out gas generated when the adhesive is cured is removed from an optical path, and contamination generated by interaction between the LD 19 and the photon energy is suppressed. Generally, an acrylic-based UV cure adhesive discharges gas even by heat. Therefore, out gas components are exhausted from the adhesives 21*a* and 21*b* by subjecting the light source module 24 to thermal processing. For example, if the acrylic-based UV cure adhesive is heated at 65° C. for 9 hours, remaining out gas amount can be reduced by 10% or less as compared with UV cure adhesive. At this time, because out gas generated from the adhesives 21*a* and 21*b* enters the small chamber 23 through a gap between the abutment surfaces of the base 1 and the LD holder 20. For this reason, the base 1 on the side of the bottom surface 1*k* is intimately mounted on the decompressor 31 after the thermal processing as shown in FIG. 12, so that out gases dispersed in the small chambers 23 at the seven locations are collectively sucked and eliminated via the through hole 22. The out gas is eliminated from the optical path in the manner described above, contamination generated by interaction between the LD 19 and the photon energy is further suppressed, and deterioration in permeability of the laser beam emitted from the LD 19 is prevented. The light source module 24 is adjusted and assembled as described above.

A UV cure adhesive is used as the adhesive 21 for fixing the LD holder 20 to the base 1, thermal processing is performed after the UV curing operation to generate out gas from the adhesive 21, out gas in the small chambers 23, each of which is formed by the stepped holes 1*a* to 1*g* of the base 1, the first collimator lens 2, the LD holder 20, and the LD 19, is sucked and exhausted from the through hole 22. Thus, it is possible to reliably remove the out gas and to prevent out gas from being generated with time.

Figure 13:
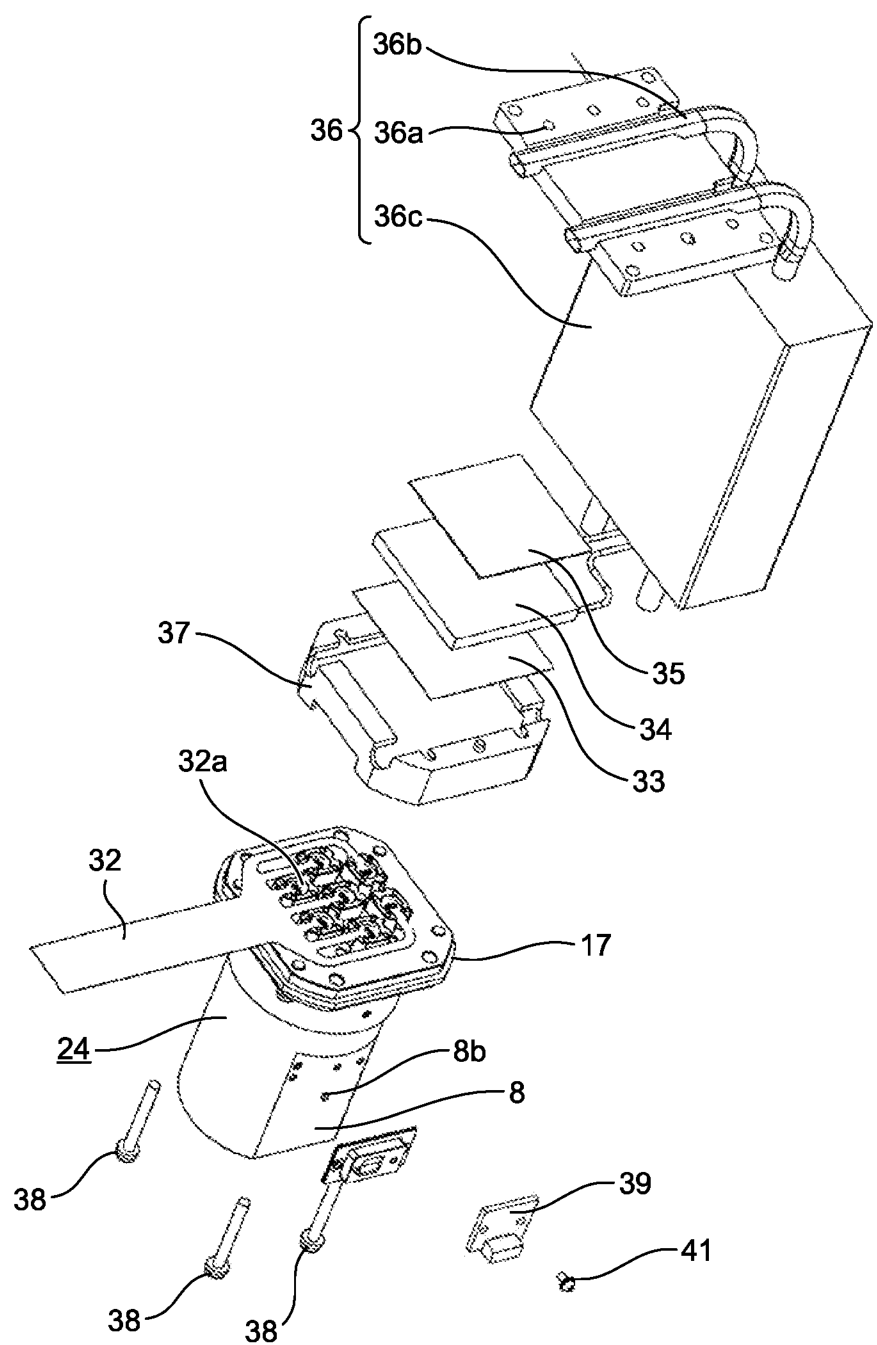
FIG. 13 depicts an exploded view of a configuration of the entire light source device according to the embodiment.
Figure 14:
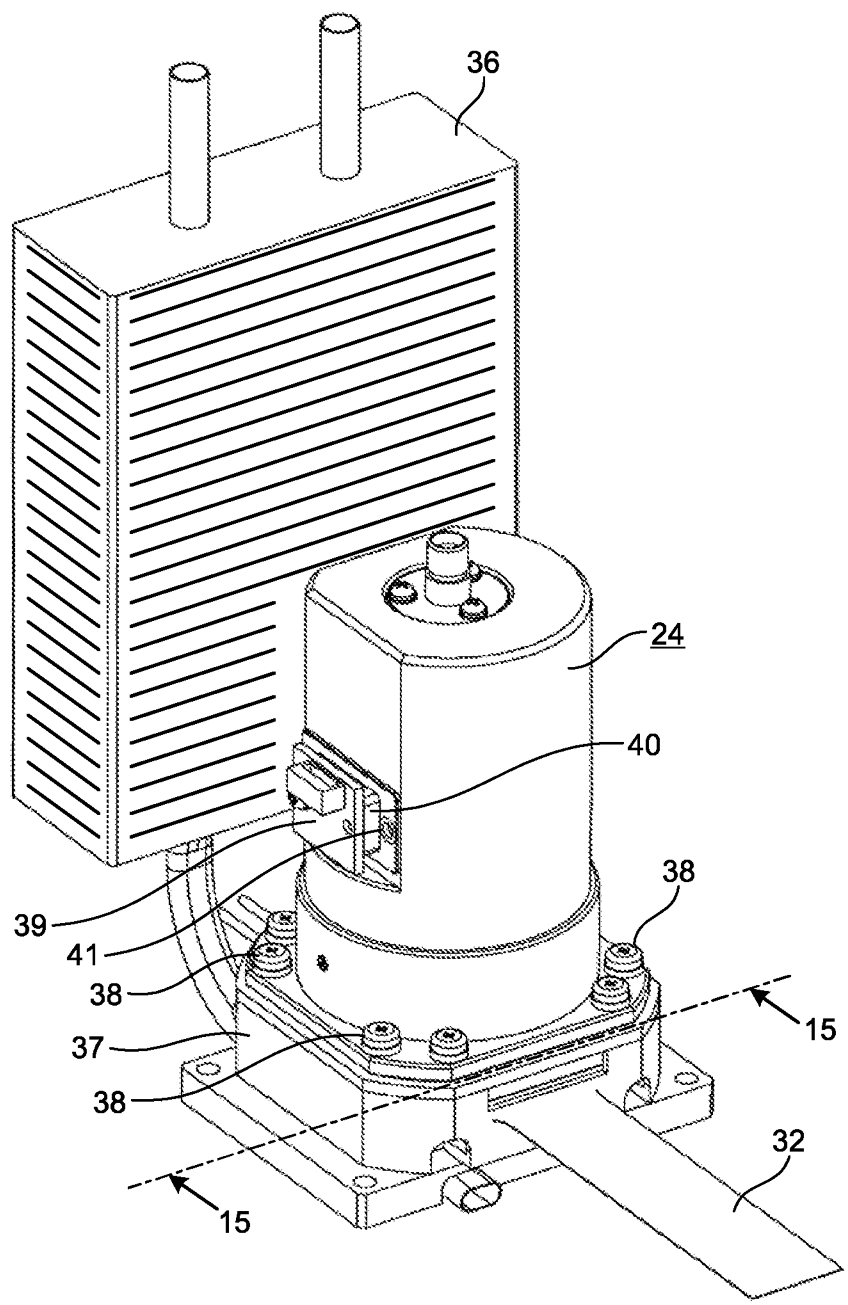
FIG. 14 depicts a perspective view of a configuration of the light source device according to the embodiment in its entirety after assembling.
Figure 15:
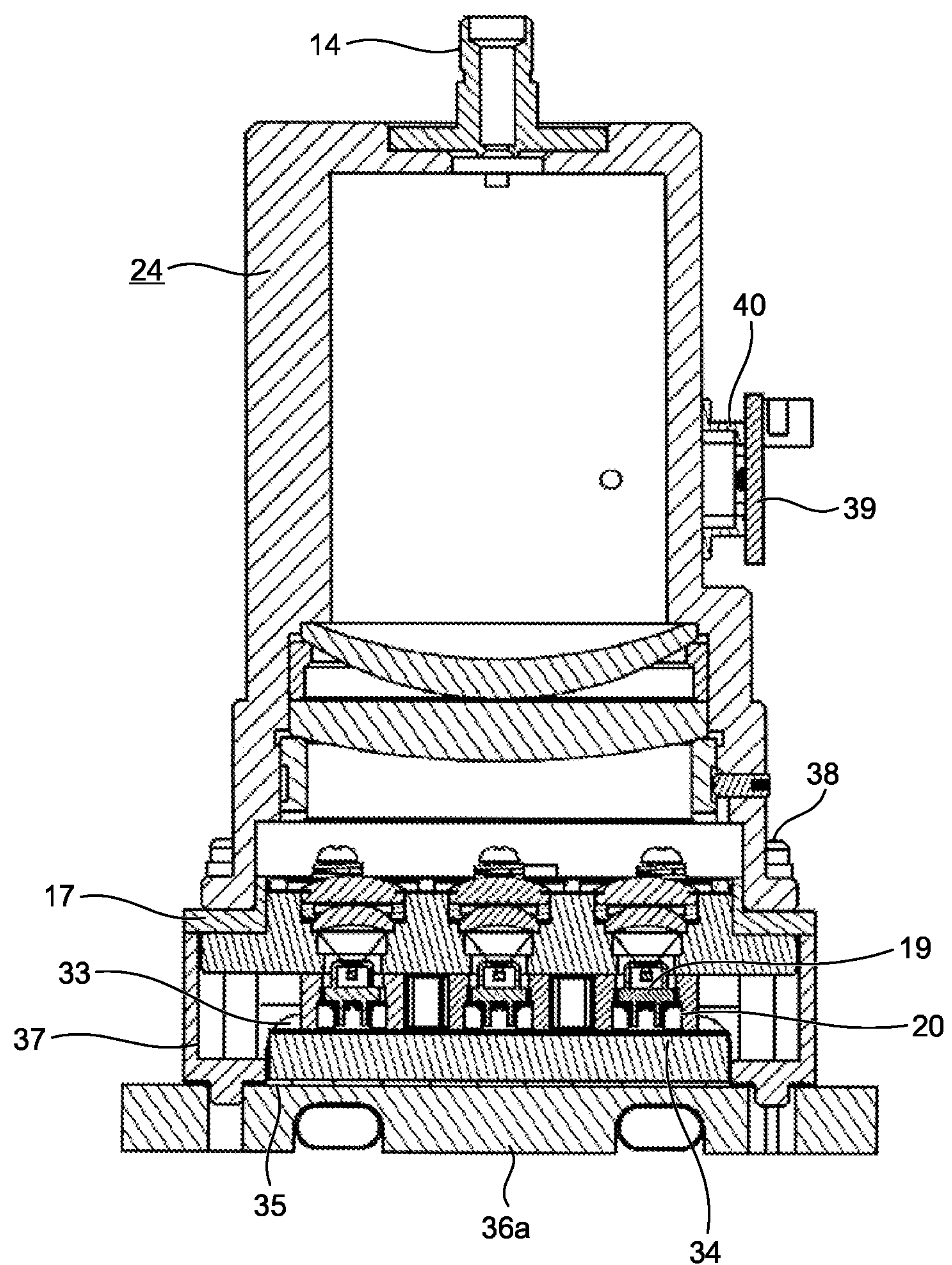
FIG. 15 depicts a sectional view of a configuration of the entire light source device according to the embodiment.
Figure 16:
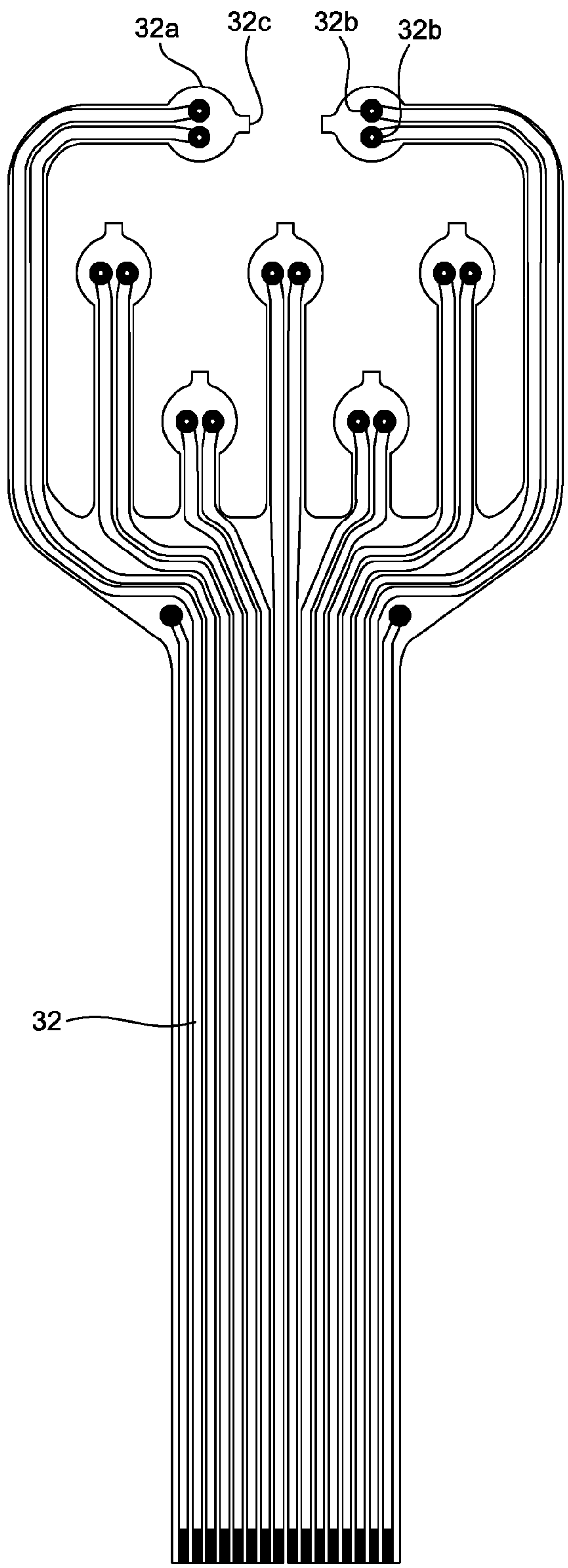
FIG. 16 depicts a configuration of a flexible printed board according to the embodiment.
Figure 17:
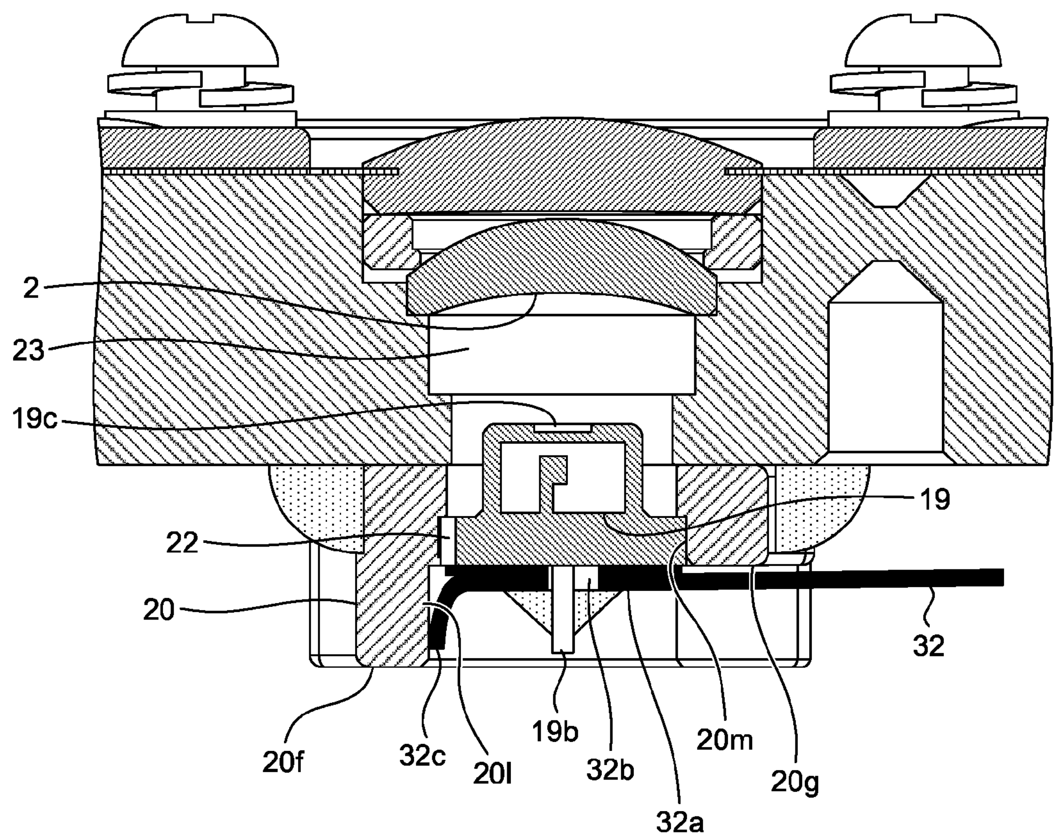
FIG. 17 depicts a sectional view explaining a soldering method of the flexible printed board according to the embodiment.
Figure 18:
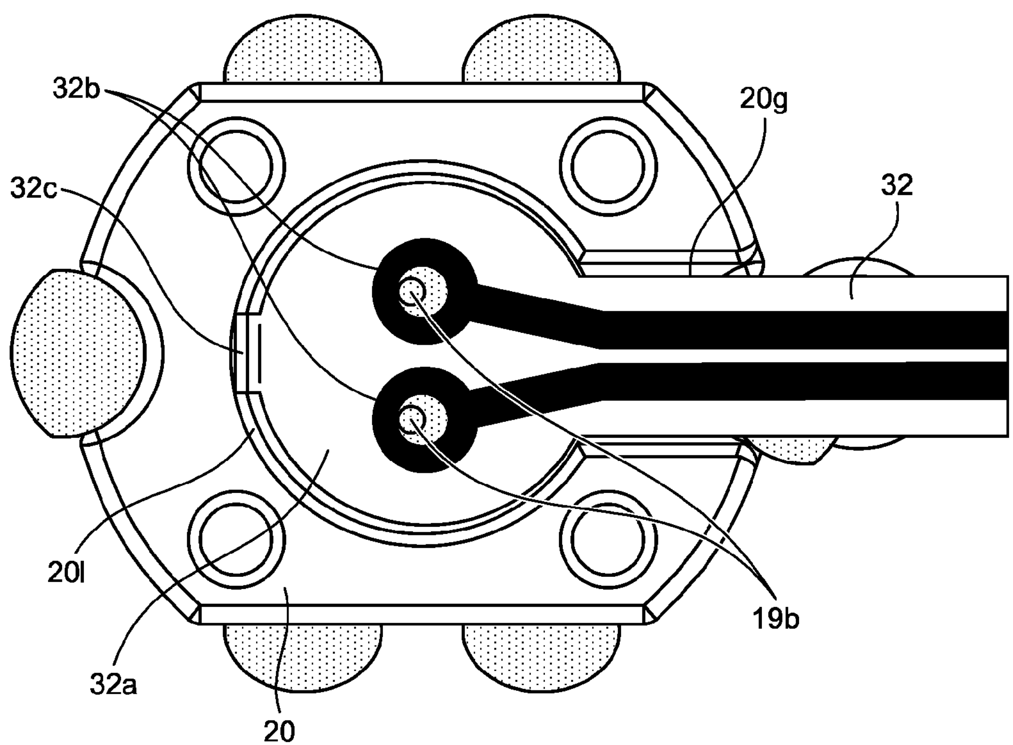
FIG. 18 depicts a bottom view explaining the soldering method of the flexible printed board according to the embodiment.

FIGS. 13 to 15 depict a configuration of the light source device in its entirety, in which a flexible printed board (FPC) 32 as a feeding unit, a radiation unit 36 as a cooling unit, and an optical sensor are mounted on the light source module 24. FIG. 13 is an exploded view, FIG. 14 is a perspective view after assembling, and FIG. 15 is a sectional view taken along a line 15-15 in FIG. 14. The FPC 32 for supplying current to the LD 19 is made of polyimide, which has excellent light resistance and heat resistance. The FPC 32 passes through the stepped portion 20*g* of the LD holder 20 and is soldered to the conduction leads 19*b* that are an anode and a cathode of the LD 19. FIGS. 16 to 18 show details of the FPC 32. As shown in FIGS. 16 to 18, the FPC 32 includes substantially circular LD-mounting portions 32*a* on which the LD 19 is mounted. Each of the LD-mounting portions 32*a* includes a soldering land 32*b* having holes, and a projection 32*c* formed on a tip end of the LD-mounting portion 32*a*. Because the projection 32*c* comes into elastic contact with an inner surface hole 201 of the LD holder 20, the conduction leads 19*b*, and the holes of the soldering land 32*b* are pushed against one side (see FIGS. 17 and 18). The LD-mounting portion 32*a* is fixed such that it is not pulled from the LD holder 20 and does not rattle even before the LD-mounting portion 32*a* is soldered to the LD 19. With this configuration, because the LD-mounting portions 32*a* of the FPC 32 are stably fixed independently, the LDs 19 can be easily and reliably soldered even when there are a plurality of the LDs 19. Because the through hole 22 is closed with the projection 32*c* of the FPC 32, flux at the time of the soldering operation does not scatter, its fumes do not enter the small chamber 23 easily, and thus it is possible to prevent unwanted material from adhering to surfaces of the laser-beam emitting window 19*c* of the LD 19 and the first collimator lens 2. It is also possible to prevent scattered light emitted from the LD 19 from leaking out from the through hole 22. Therefore, it is possible to avoid a case that a material that can be a cause of contamination is generated from a part that is arranged therearound by leaked scattered light.

A thermal-conductive sheet 33 is made of a silicon-based elastic material having thickness of 0.5 millimeter. The Peltier module 34 includes a Peltier device, and a surface temperature thereof can be controlled by flowing a current through the Peltier device. The thermal-conductive sheet 35 has the same configuration as that of the thermal-conductive sheet 33. The radiation unit 36 includes a heat block 36*a*, a heat pipe 36*b*, and a fin 36*c*. A Peltier cover 37 is a molded article of polycarbonate having glass fibers like the spacer 17. The Peltier cover 37 is designed such that it can be positioned with respect to the base 1, the Peltier module 34 and the heat block 36*a*. Four fixing screws 38 are uniformly fastened to the heat block 36*a* through the Peltier cover 37 from the side of the base 1. With this configuration, the thermal-conductive sheet 33 and the thermal-conductive sheet 35 are elastically deformed, and the LD holder 20, the thermal-conductive sheet 33, the Peltier module 34, the thermal-conductive sheet 35, and the heat block 36*a* are intimately fixed. The Peltier cover 37 is positioned to a height where the Peltier cover 37 comes into contact with the spacer 17 and the heat block 36*a* that are fixed to the base 1 in a state that the fixing screws 38 are fastened, and the base 1 and the heat block 36*a* cannot approach each other more than this. Therefore, it is possible to avoid a case where an excessive force is applied to the Peltier module 34 due to excessive fastening of the fixing screws 38, or a vibration or an impact from outside, and the Peltier module 34 is damaged.

The heat block 36*a* is fixed to the base 1 by the conductive fixing screws 38 through the plastic Peltier cover 37. With this configuration, a thermal capacity of a portion thereof cooled by the Peltier module 34 is reduced, and the LD 19 can be efficiently cooled. That is, the energy required for cooling the LD 19 can be reduced. Also, the lifetime of the LD 19 can be increased.

An optical sensor is fixed to an optical sensor module 39. The optical sensor module 39 is fixed to the lens barrel 8 by a screw 41 through a sensor holder 40 so that a laser beam leaking from a hole 8*b* formed in a side surface of the lens barrel 8 can be detected. A position and a diameter of the hole 8*b* are designed such that the optical sensor is not saturated.

The operation of the light source device is described. First, to make the LD 19 emit light, a predetermined current flows through the FPC 32 in a state that the LDs 19 are connected to the control board in series. At this time, because the LD 19 generates heat, the LD 19 is cooled to a predetermined temperature by the Peltier module 34 through the LD holder 20 and the thermal-conductive sheet 33 based on temperature information of a thermistor (not shown) fixed to the base 1. Because the lens barrel 8 is thermally separated from the base 1 by the spacer 17, a thermal capacity in a range where the temperature is adjusted does not become large more than necessary, and it is possible to efficiently adjust the temperature. Heat generated on a surface opposite from the thermal-conductive sheet 33 when the Peltier module 34 is driven is transmitted to the heat block 36*a* through the thermal-conductive sheet 35, and transmitted to the fin 36*c* through the heat pipe 36*b* and is radiated in the air. The optical sensor module 39 can detect a laser beam that reflects on an inner surface of the lens barrel 8 when the LD 19 emits light and that leaks from the hole 8*b*. The optical sensor module 39 compares the laser beam with laser power emitted from the optical fiber 16, thereby monitoring whether there is abnormality such as bending or deterioration of the optical fiber 16. When abnormal condition is detected, the optical sensor module 39 is used for emergency stopping processing for interrupting the current that is supplied to the LD 19. The LD 19 is driven at necessary temperature and current, and is operated while monitoring that power is normally emitted from the optical fiber 16.

According to the light source device of the embodiment, the conduction lead 19*b* of the LD 19 and the FPC 32 are soldered to each other in the inner surface hole 201 of the LD holder 20, and the Peltier module 34 is intimately arranged on the lower surface 20*f* of the LD holder 20 through the thermal-conductive sheet 33. With this configuration, the FPC 32 can be connected using a small space, and LD 19 can be cooled efficiently and easily without sealing the LD 19 air-tightly.

The through hole that is in communication with outside air is provided in the LD holder 20 to which the LD 19 is fixed, the position of the LD holder is adjusted, and it is adhered and fixed. With this configuration, laser beams are synthesized, light is concentrated into the optical fiber, and the productivity and reliability are high although the device is inexpensive.

According to the present invention, positions of an optical axis of a lens and an optical axis of a semiconductor laser can be easily and precisely adjusted by sliding a holder on an abutment surface, and the holder can be reliably fixed to a base by an adhesive applied so as to straddle a side surface of the holder and a region that is adjacent to the abutted portion of the base with respect to the holder on the abutment surface.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A light source device that concentrates laser beams emitted from a plurality of laser modules and emits the concentrated laser beams, comprising:

a plurality of cylindrical holders, each holder individually having one hole into which one of the laser modules is fitted and fixed;

a plate-like base that has a first surface, a second surface opposite to the first surface, and a plurality of through holes through which the laser beams from the plurality of laser modules fixed to the holders pass, the holders abutting against the first surface so as to connect the holes thereof to the through holes of the base, the second surface of the base being arranged with a plurality of lenses corresponding to the through holes; and adhesives applied to outer corners of abutment portions, at which the base and the holders abut against each other, for fixing the base and the holders to each other; wherein each of the holders has, on its outer side surface, a plurality of notched portions that are symmetric about a center axis of an inner surface hole of the holder and provided for an entire height of the outer side surface, and the adhesives are applied to the notched portions of the holders, each of the plurality of laser modules includes a notch on its outer surface, a hermetic space surrounded by the holders, the base, the lenses, and the laser modules in a state that the holders and the base abut against each other is formed, a ventilation passage that connects the hermetic space and a space which presents on a side opposite to the hermetic space across the laser module is formed, and the ventilation passage is formed between each laser module and said inner surface hole of the holder by the notch of the laser module, and the hermetic space is in communication with outside air through the ventilation passage.

2. The light source device according to claim 1, wherein a light emitting point of the laser module is substantially flush with the first surface of the base.

3. The light source device according to claim 1, wherein the ventilation passage exhausts out gas that is generated from the adhesive and remains in the hermetic space, or out gas that is discharged from the adhesive of ultraviolet cure type by subjecting the adhesive to a thermal processing.

4. The light source device according to claim 1, wherein the holder includes a groove in which a flexible printed board for supplying a current to the laser module is arranged, and the groove is located on a side opposite to an abutment surface of the holder abutting against the base.

5. The light source device according to claim 1, wherein the holder includes a plurality of positioning recesses arranged symmetrically about an optical axis of the laser module, the positioning recesses are located on a side opposite to an abutment surface of the holder at which the base and the holder abuts.

6. The light source device according to claim 1, wherein the laser modules are fixed to the holders such that polarizing directions thereof are same, and the holders to which the laser modules are fixed are mounted on the base such that orientation of part of the holders are changed and polarizing directions of the laser modules are different from each other.

7. The light source device according to claim 1, wherein each of the holders has plural pairs of the notched portions, the notched portions in each pair being symmetric about the center axis of the holder to each other.

8. The light source device according to claim 1, wherein the plurality of notched portions are provided on each outer surface and include at least one flat surface and at least one concave surface.

9. The light source device according to claim 1, wherein the plurality of holders include at least seven holders.

* * * * *